United States Patent [19]

Heid et al.

[11] Patent Number: 5,523,688

[45] Date of Patent: Jun. 4, 1996

[54] METHOD FOR OPERATING A MAGNETIC RESONANCE IMAGING APPARATUS TO OBTAIN A HIGH $T_2$ CONTRAST

[75] Inventors: Oliver Heid, Haagstr. 12, 91054 Erlangen; Michael Deimling, Am Steinbruch 2, 91096 Moehrendorf, both of Germany

[73] Assignees: Oliver Heid, Erlangen; Michael Deimling, Moehrendorf, both of Germany

[21] Appl. No.: 274,332

[22] Filed: Jul. 13, 1994

[30] Foreign Application Priority Data

Aug. 13, 1993 [DE] Germany ............... 43 27 321.1

[51] Int. Cl.$^6$ .................................................. G01R 33/48
[52] U.S. Cl. .................................................. 324/309
[58] Field of Search ............................. 324/307, 309, 324/300; 128/653.2

[56] References Cited

U.S. PATENT DOCUMENTS

| | | | |
|---|---|---|---|
| 4,521,733 | 6/1985 | Bottomley et al. | 324/309 |
| 4,820,984 | 4/1989 | Kuhn et al. | 324/309 |
| 4,825,160 | 4/1989 | Kuhn | 324/309 |
| 4,833,407 | 5/1989 | Holland et al. | 324/309 |
| 4,901,020 | 2/1990 | Ladebeck et al. | 324/309 |
| 5,055,790 | 10/1991 | Siuciak et al. | 324/309 |
| 5,270,654 | 12/1993 | Feinberg et al. | 324/309 |
| 5,298,862 | 3/1994 | Hennig | 324/309 |

OTHER PUBLICATIONS

"Elimination of Transverse Coherences in Flash MRI," Crawley et al., Mag. Res. in Med. 8, 1988, pp. 248–260.
"Echo–Shifted Flash for Susceptibility Bolus Tracking: Combining a Short TR with Very Large Flexibility in T2* Sensitivity," Liu et al., SMRM Abstracts, vol. 11, 1992, p. 1817.
"A New Multi-slice Technique Based on TE-Interleaving," Bishop et al, SMRM Abstracts, vol. 9, 1990, p. 437.

Primary Examiner—Sandra L. O'Shea
Assistant Examiner—Raymond Y. Mah
Attorney, Agent, or Firm—Hill, Steadman & Simpson

[57] ABSTRACT

Nuclear spins are excited in an examination subject by a sequence of radio-frequency pulses that are emitted in under the influence of slice selection gradients, with n different slices of the examination subject being excited. Due to read-out gradients, n gradient echoes respectively allocated to a slice are generated such that each gradient echo allocated to a radio-frequency pulse comes to lie between two successive radio-frequency pulses. Further slices can thus be excited within the echo time of a gradient echo of a specific slice. A $T_2^*$ contrast image can thus be obtained with a significantly shorter examination time than was heretofore achievable.

8 Claims, 5 Drawing Sheets

METHOD FOR OPERATING A MAGNETIC RESONANCE IMAGING APPARATUS TO OBTAIN A HIGH $T_2$ CONTRAST

BACKGROUND OF THE INVENTION

1. Field of the Invention

The present invention is directed to a method in the form of a pulse sequence, for operating a magnetic resonance imaging (nuclear magnetic resonance tomography) apparatus.

2. Description of the Prior Art

The $T_2^*$ contrast is of particular significance for functional imaging in a magnetic resonance tomography apparatus. The $T_2^*$ contrast is the effective transverse relaxation time, into which the signal decay due to spin-spin couplings and the influence of local field inhomogeneities. Effects that influence the $T_2^*$ relaxation time are usually exploited for the functional imaging. These can be intrinsic effects as occur, for example, in the oxygenation/de-oxygenation of blood. Magnetic contrast agents that are distinguished from tissue by an especially pronounced $T_2^*$ contrast, however, can also be employed.

The $T_2^*$ contrast is directly dependent on the echo time, i.e. on the interval between the excitation of a nuclear magnetic resonance signal and the read-out of the echo signal. Long echo times must therefore be selected to obtain a high $T_2^*$ contrast. This leads to long data acquisition times. Short data acquisition times are required, however, to achieve functional imaging of rapidly occurring processes.

In order to solve this problem, Lin G. et al, SMRM Abstract 11, page 1817 (1992), proposed a method that is referred to therein as "echo-shifted FLASH". The echo signal allocated to an excitation pulse is thereby acquired only in one of the subsequent repetition periods, i.e. between two following excitations. The desired, long echo times are thus obtained even given short repetition times, and thus short measuring times. The same slice is always excited in this method. In order to dephase undesired echoes, additional gradient pulses are provided. The dephasing of undesired echoes, however, is not completely successful in practice, so that the method is relatively susceptible to artifacts.

Bishop et al in SMRM-Abstracts 9, page 437 (1990), disclose a multi-slice technique wherein a plurality of slices are successively excited within an echo time. Spin echoes are generated by locking 180° radio-frequency pulses onto the same slices. With this method, a substantial time gain can be achieved when measuring a plurality of slices. Due to the use of spin echoes, however, local magnetic field inhomogeneities are largely compensated, so that the resulting images exhibit no $T_2^*$ contrast, but, instead exhibit a $T_2$ contrast. This method is therefore not suitable for functional imaging wherein effects to which only the $T_2^*$ relaxation time is susceptible play a critical role.

SUMMARY OF THE INVENTION

An object of the invention is to provide a method in the form of a pulse sequence for operating a magnetic resonance imaging apparatus wherein a high $T_2^*$ contrast can be achieved in multi-slice exposures and wherein the susceptibility to artifacts is slight.

The above object is achieved in accordance with the principles of the present invention in a method for operating a magnetic resonance imaging apparatus, in the form of a pulse sequence, wherein spins are excited in an examination subject by a sequence of radio frequency pulses, which are generated under the influence of slice selection gradients for exciting n different slices of the examination subject. Gradient echoes arise from the nuclear spins, which are associated with respective slices. These are read-out by means of unipolar or bipolar read-out gradients such that each gradient echo arises between two successive radio frequency pulses.

DESCRIPTION OF THE PREFERRED EMBODIMENTS

Figure 1:
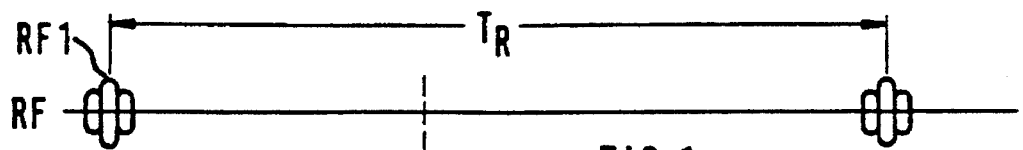
FIGS. 1–5 illustrate a gradient echo sequence of the type known in the prior art for explaining the problem to which the inventive method is directed.
Figure 2:
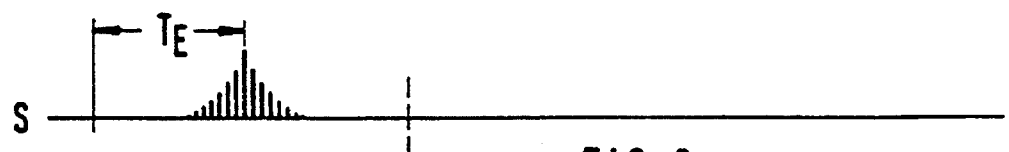
Figure 3:
Figure 4:
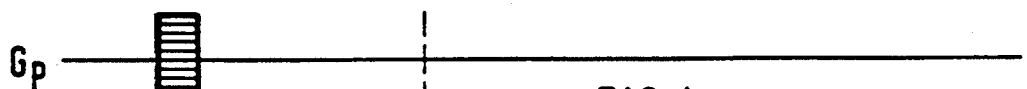
Figure 5:
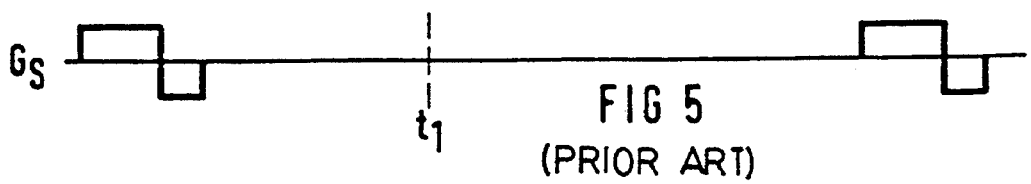

For explaining the problem arising in conjunction with known pulse sequences for imaging, which is solved by the inventive method, FIGS. 1–5 show a conventional gradient echo sequence. A radio-frequency pulse RF1 is emitted onto a specimen (FIG. 1) under the influence of a slice selection gradient $G_S$ (FIG. 5). Nuclear spins are thus excited in a slice of the examination subject. Subsequently, the dephasing caused by the positive part of the slice selection gradient $G_S$ is cancelled by a negative pulse of the slice-selection gradient $G_S$. At the same time, a phase-coding gradient $G_P$ (FIG. 4) and a negative pulse of a read-out gradient $G_R$ (FIG. 3) are activated. Due to a following positive pulse of the read-out gradient $G_R$, the spins dephased by the negative pulse are in turn rephased, so that a gradient echo signal S (FIG. 2) arises after an echo time $T_E$. This signal is sampled, digitized and entered into a row of a raw data matrix.

This sequence is repeated n-times with a repetition time $T_R$ with respectively different values of the phase-coding gradient $G_B$, so that n gradient echo signals for n rows of the raw data matrix are obtained.

An image of the excited slice is acquired from this raw data matrix by two-dimensional Fourier transformation. In most cases, a plurality of slices lying side-by-side are examined. Given examination of a plurality of slices, it is known that examination time can be saved by implementing an excitation of a further slice already during the repetition time $T_R$, for example at time T1, and a nuclear magnetic resonance signal is acquired from this further layer during the following repetition phase $T_R$ by repeating the described pulse sequence. Such a method, which is standard in nuclear magnetic resonance tomography, is also referred to as "$T_R$-interlaced".

Figure 6:
FIGS. 6–8 illustrate a further gradient echo sequence of the prior art, likewise for explaining the problem.
Figure 7:
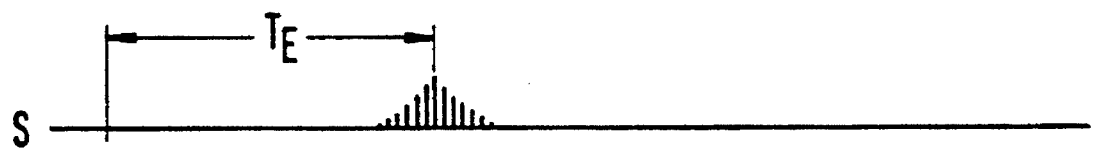
Figure 8:
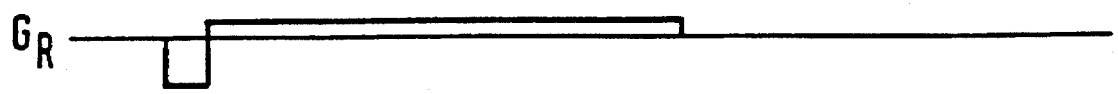

As already stated at the outset, long echo times $T_E$ are often required for functional imaging with high $T_2^*$ contrast. This is shown in FIGS. 6–8. The long echo time is achieved by making the positive part of the read-out gradient $G_R$ (FIG. 8) small. The rephasing condition is then satisfied when the amplitude/time integral of the positive gradient part is equal to the amplitude/time integral of the negative gradient part of the read-out gradient $G_R$. The gradient echo signal S (FIG. 7) arises at this time. Thus, when the amplitude of the positive part of the read-out gradient $G_R$ is made low, the echo time $T_E$ becomes long. The phase-coding gradient $G_P$ and the slice selection gradient $G_S$ coincide with those shown in FIGS. 4 and 5.

As may be seen from FIGS. 6 and 8, the repetition time $T_R$ would have to be lengthened given long echo times $T_E$ in order to be able to acquire a plurality of slices within a repetition time $T_R$. Thus no measuring time can be saved by using the above-described method of "$T_R$-interlaced".

Figure 9:
FIGS. 9–13 illustrate a pulse sequence as a first exemplary embodiment of the method of the invention.
Figure 13:
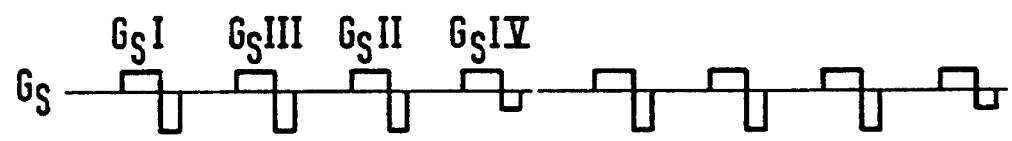
Figure 14:
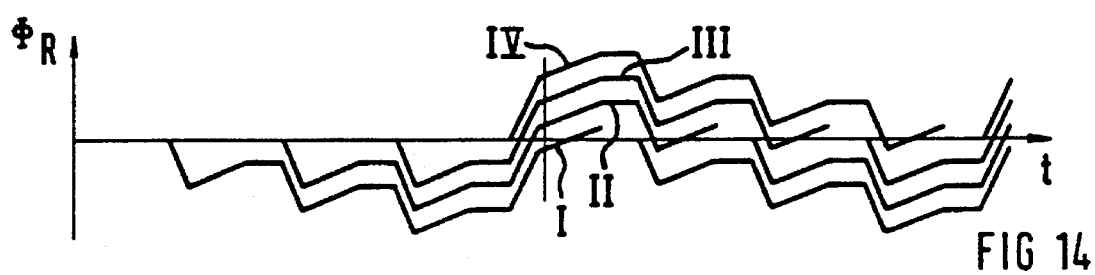
FIGS. 14 and 15 illustrate the phase curves associated with the pulse sequence of FIGS. 9–13.
Figure 15:
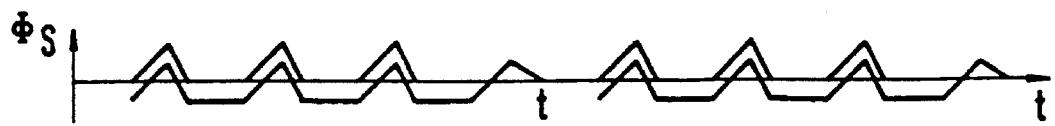
Figure 16:
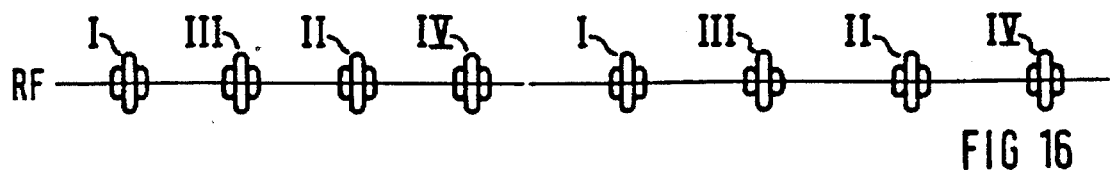
FIGS. 16–20 illustrate a further pulse sequence as a second exemplary embodiment of the method of the invention.
Figure 17:
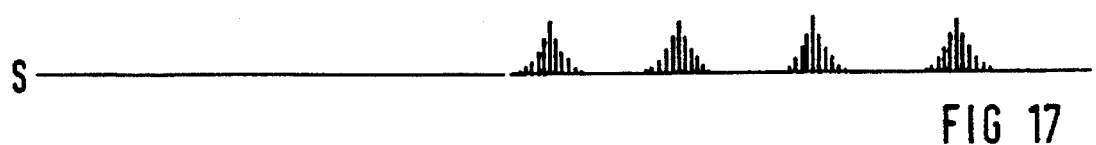
Figure 18:
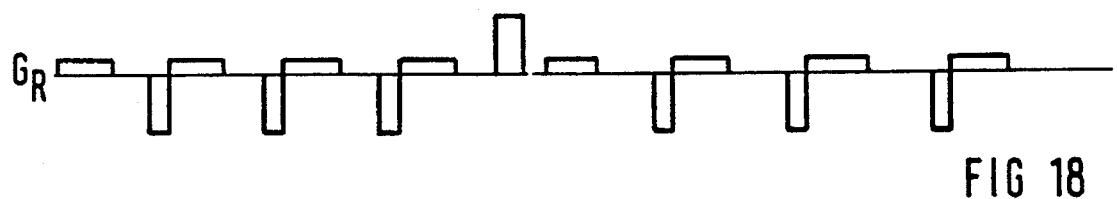
Figure 19:
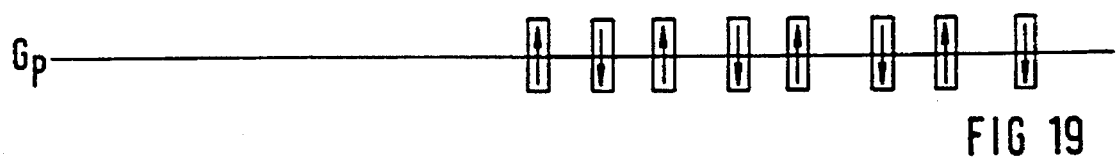
Figure 20:
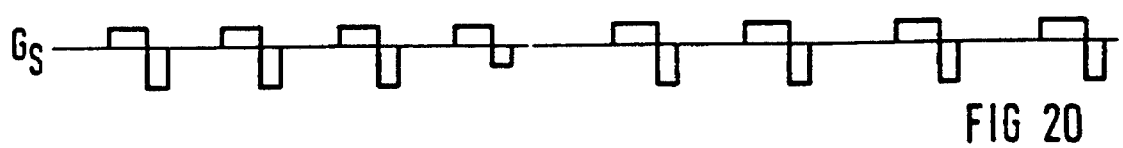
Figure 21:
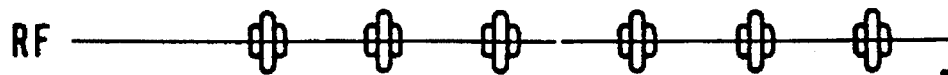
FIGS. 21–25 illustrate a further pulse sequence as a third exemplary embodiment of the method of the invention.
Figure 22:

A first exemplary embodiment of the method of the invention is shown in FIGS. 9–15. Radio-frequency pulses RF having a relatively short repetition time are emitted (FIG. 9). These radio-frequency pulses RF become slice-selective due to simultaneous activation of slice selection gradients $G_S$ (FIG. 13), namely for different slices I–IV lying parallel to one another. A bipolar read-out gradient $G_R$ (FIG. 11) is applied after every radio-frequency pulse RF. The amplitude/time areas of this bipolar read-out gradient $G_R$, however, are fashioned such that no rephasing in read-out direction occurs during the first excitation phase A (FIG. 13). The phase curve $\Phi_R$ in the read-out direction is shown in FIG. 14 and the phase curve $\Phi_S$ in the slice-selection direction is shown in FIG. 15.

Figure 10:

After the four radio-frequency pulses RF have been emitted onto the four slices I–IV, a strong, common read-out gradient $G_{RG}$ (FIG. 11) in the positive direction and a phase-coding gradient $G_P$ (FIG. 12) are simultaneously activated. The same read-out gradient pulses $G_R$ as in the first part of the sequence again subsequently follow in the sequence part B, whereby all read-out gradients with the exception of the first are bipolar. As may be seen from the phase plot for $\Phi_R$ and $\Phi_S$, these read-out gradients, however, lead to re-phasing of the nuclear spins excited in the slices I–IV and, thus, lead to four successive gradient echo signals S1–S4 (FIG. 10). A gradient echo signal always occurs when the rephasing condition is satisfied, i.e. when the associated phase curves pass through zero. The gradient/time areas are fashioned such that the resultant areas of the read-out gradients $G_{R1}$ through $G_{R3}$ following the three radio-frequency pulses RFI, RFIII and RFII and of the common read-out gradient $G_{RG}$ have relative ratios 1:1:1:2.5. Further, the negative part of the slice selection gradient $G_S$IV comprises only half the area of the negative parts of the slice selection gradients $G_S$I, $G_S$III and $G_S$II. The rephasing of the nuclear spins thus proceeds as shown in the phase plots of FIGS. 14 and 15. The first gradient echo signal S1 arises from the first excitation of the first slice I, etc. All gradient echo signals S1 through S4 are phase-coded in the same way by the common phase-code gradient $G_P$.

The slices I–IV are not excited in their spatial sequence but in the sequence I, III, II, IV. Signal couplings from the slices are avoided because two spatially neighboring slices are not excited in direct succession.

New radio-frequency excitation pulses are emitted during the sequence part B, whereby these new radio-frequency excitation pulses again selectively influence the individual slices I–IV due to the simultaneous application of slice selection gradients $G_S$. The chronological sequence is thereby controlled such that the radio-frequency excitation pulses RF lie between the gradient echo signals S1 through S4.

The sequence part B is repeated n times with different values of the phase-coding gradient $G_P$, whereby a respective gradient echo signal is acquired for each of the four slices I–IV. Thus, n rows of four raw data matrices can be filled for four slices.

Since the new excitation pulses are already emitted during the echo time $T_E$ of preceding excitations, this is also referred to as "$T_E$-interlaced" as distinguished from "$T_R$-interlaced".

With this method, thus, the raw data of a plurality of slices can be measured in a short time even given long echo times and application of gradient echo sequences. In the illustrated example, for example, a time gain by a factor of four is achieved compared to a conventional non-interlaced sequence.

It should also be emphasized that the read-out gradient $G_R$ need not be activated in sequence part A in and of itself; however, it is simpler for the sequence control when the gradients are identically activated over the entire sequence execution.

By contrast to the initially cited "echo-shifted flash" method, it is not necessary to refocus echoes outside an individual $T_R$-interval. Since the signals remain dephased after the measurement, the effective gradient spoiler pulse is ultimately obtained. Primary and secondary echoes can thus be avoided for two $T_R$-intervals. This effect is explained in detail in the article by Crawley et al, in "Magnetic Resonance in Medicine" Vol. 8 pages 248–260. By suppressing phase coherencies outside the desired data acquisition times, additional echo signals that would otherwise lead to artifacts are largely suppressed.

If the dephasing of the nuclear spins outside the data acquisition times established with the described sequence is not adequate, a radio-frequency phase spoiling can be additionally provided. Such a pulse sequence is shown in FIGS. 16–20. This differs from the sequence shown in FIGS. 9–15 in that the radio-frequency pulses RF have a changing phase relation. Further, a common phase-coding gradient $G_P$ for all four gradient echoes S1–S4 is not employed as in FIG. 12; according to FIG. 19, instead, a separate phase-coding gradient $G_P$ is activated before every gradient echo signal S1–S4 and the phase is in turn reset by an opposite phase-coding gradient $G_P$ after every gradient echo signal S1–S4. Disturbing phase coherencies that lead to artifact-forming, additional echoes can thus be completely eliminated.

Figure 11:
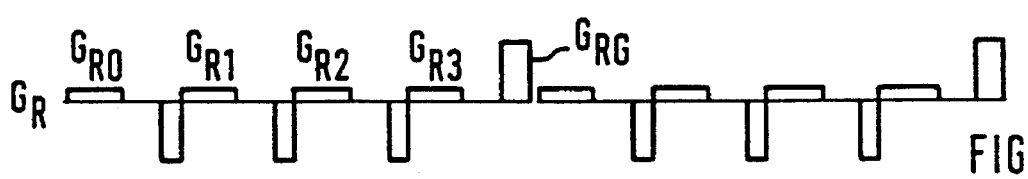
Figure 12:
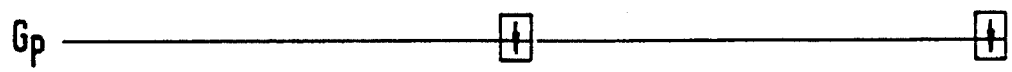
Figure 23:
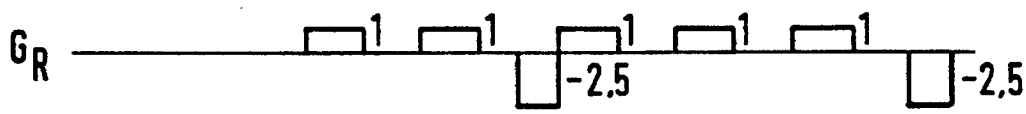
Figure 24:
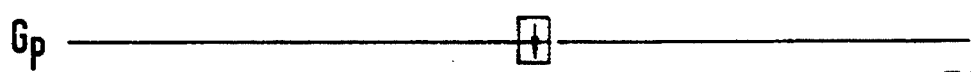
Figure 25:
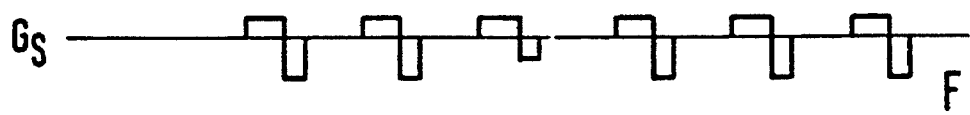
Figure 26:
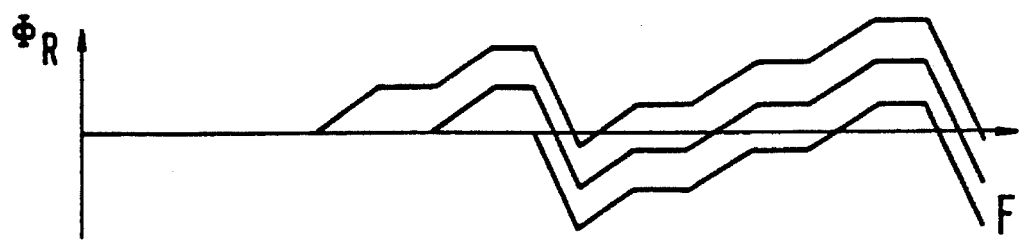
FIGS. 26 and 27 illustrate the phase curves associated with the pulse sequence of FIGS. 21–25.
Figure 27:

In the exemplary embodiment shown in FIGS. 21–27, the read-out gradient $G_R$ of FIG. 23 is simplified in comparison to the read-out gradient of FIG. 11 insofar as only unipolar gradient pulses are provided for the individual gradient echo signals S1–S4. Only the preceding, common gradient pulse $G_{RG}$ has a polarity opposite that of the read-out gradient pulses $G_R$ allocated to the individual gradient echo signals S1–S4. Ultimately, the gradient time integrals of the bipolar read-out gradient pulses of FIG. 11 are combined in this embodiment to form a unipolar gradient pulse so that the rephasing conditions are satisfied at the same points in time. The phase curve $\Phi_R$ in the read-out direction—as shown in FIG. 26—is merely somewhat different between excitation and rephasing. By largely foregoing bipolar gradient pulses, the number of switching events becomes lower, so that fewer eddy currents arise and demands on the gradient amplifier for the read-out direction are relieved.

Although various modifications and changes to the presently preferred embodiments described herein will be apparent to hose skilled in the art, such changes and modifications can be made without departing from the spirit and scope of the present invention and without diminishing its attendant advantages. Therefore, the appended claims are intended to cover such changes and modifications.

We claim as our invention:

1. A method for operating a nuclear magnetic resonance tomography apparatus comprising the steps of:

exciting nuclear spins in an examination subject by subjecting said subject to a sequence of successive radio frequency pulses generated in the presence of respective slice selection gradients and thereby exciting nuclear spins in n different slices of said examination subject;

in a read-out phase, subjecting said examination subject to a plurality of read-out gradients for reading out gradient echoes caused by said nuclear spins, each gradient echo being associated with one of said slices, and said read-out gradients being generated in a sequence so that each gradient echo is between two successive radio frequency pulses; and generating an image of at least one of said slices of said examination subject from said gradient echoes.

2. A method as claimed in claim 1 comprising the additional steps of:

allocating one read-out gradient pulse to each gradient echo; and additionally generating a common read-out gradient pulse before each read-out phase.

3. A method as claimed in claim 1 comprising the additional steps of:

allocating a unipolar read-out gradient pulse to each gradient echo; and generating a common unipolar read-out gradient pulse before each read-out phase.

4. A method as claimed in claim 1 comprising the additional step of maintaining said nuclear spins dephased between each read-out phase and an immediately following one of said radio frequency pulses.

5. A pulse sequence as claimed in claim 1 comprising the additional step of simultaneously phase coding all gradient echoes allocated to a selected group of slices before a first of said gradient echoes.

6. A method as claimed in claim 1 comprising the additional step of reading out each gradient echo allocated to a slice immediately before a next-successive excitation of the same slice.

7. A method as claimed in claim 1 comprising the additional step of phase spoiling any phase coherencies of said radio frequency pulses in a slide after obtaining the gradient echo associated with that slice.

8. A method as claimed in claim 7 comprising the additional steps of:

simultaneously phase coding all gradient echoes associated with a selected group of slices before each gradient echo; and resetting said phase coding following each gradient echo.

* * * * *